US008450119B2

United States Patent
Torng et al.

(10) Patent No.: US 8,450,119 B2
(45) Date of Patent: May 28, 2013

(54) MAGNETIC TUNNEL JUNCTION PATTERNING USING TA/TAN AS HARD MASK

(75) Inventors: Chyu-Jiuh Torng, Pleasanton, CA (US); Wei Cao, San Jose, CA (US); Terry Ko, Millbrae, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 56 days.

(21) Appl. No.: 11/378,555

(22) Filed: Mar. 17, 2006

(65) Prior Publication Data

US 2007/0215911 A1  Sep. 20, 2007

(51) Int. Cl.
*H01L 29/82* (2006.01)
*H01L 21/00* (2006.01)

(52) U.S. Cl.
USPC ........... 438/3; 438/263; 438/717; 438/689; 438/142; 438/591; 257/256; 257/420; 257/421; 257/E21.665; 257/E21.662

(58) Field of Classification Search
USPC .......... 257/256, E21.665, E21.662, 427, 257/420–426; 438/263, 3, 717, 689.142, 438/591
See application file for complete search history.

(56) References Cited

U.S. PATENT DOCUMENTS

| 6,518,588 | B1 * | 2/2003 | Parkin et al. ............... 257/3 |
| 6,635,496 | B2 | 10/2003 | Ning |
| 6,713,802 | B1 | 3/2004 | Lee |
| 6,806,096 | B1 | 10/2004 | Kim et al. |
| 6,815,248 | B2 | 11/2004 | Leuschner et al. |
| 6,849,465 | B2 | 2/2005 | Park et al. |
| 6,882,563 | B2 | 4/2005 | Asao |
| 6,900,490 | B2 | 5/2005 | Asao et al. |
| 6,916,677 | B2 | 7/2005 | Nakajima et al. |
| 2004/0063223 | A1 * | 4/2004 | Costrini et al. ............ 438/3 |
| 2005/0016957 | A1 | 1/2005 | Kodaira et al. |
| 2005/0277206 | A1 | 12/2005 | Gaidis et al. |
| 2005/0277207 | A1 | 12/2005 | Costrini et al. |
| 2005/0282295 | A1 * | 12/2005 | Raberg ..................... 438/3 |
| 2007/0020934 | A1 * | 1/2007 | Gaidis et al. ............ 438/689 |

* cited by examiner

*Primary Examiner* — Cathy N Lam
(74) *Attorney, Agent, or Firm* — Saile Ackerman LLC; Stephen B. Ackerman

(57) ABSTRACT

An MTJ MRAM cell is formed by using a reactive ion etch (RIE) to pattern an MTJ stack on which there has been formed a bilayer Ta/TaN hard mask. The hard mask is formed by patterning a masking layer that has been formed by depositing a layer of TaN over a layer of Ta on the MTJ stack. After the stack is patterned, the TaN layer serves at least two advantageous purposes: 1) it protects the Ta layer from oxidation during the etching of the stack and 2) it serves as a surface having excellent adhesion properties for a subsequently deposited dielectric layer.

2 Claims, 3 Drawing Sheets

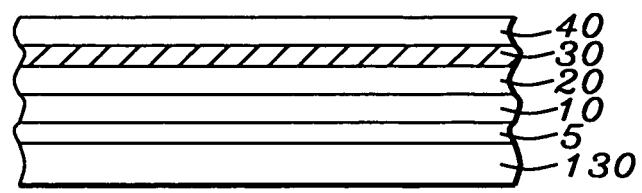
FIG. 1 - Prior Art
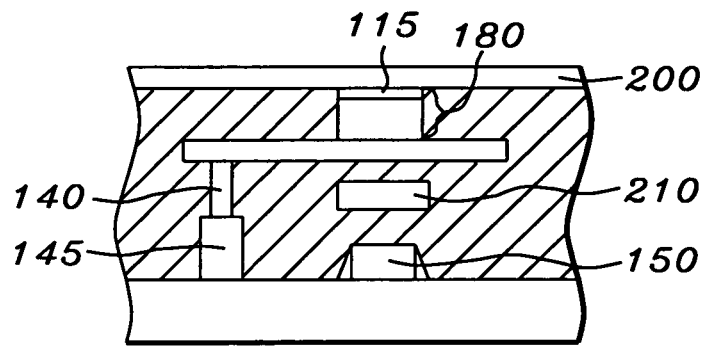
FIG. 2 - Prior Art
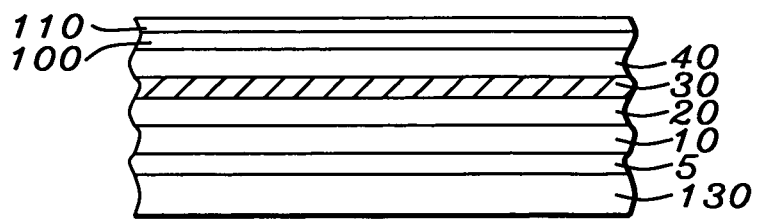
FIG. 3

MAGNETIC TUNNEL JUNCTION PATTERNING USING TA/TAN AS HARD MASK

BACKGROUND OF THE INVENTION

1. Field of the Invention

This invention relates to the fabrication of a magnetic tunneling junction (MTJ) cell and more particularly to the nature of the etching processes used in the fabrication.

2. Description of the Related Art

The magnetic tunneling junction (MTJ) device, is a form of giant magnetoresistive (GMR) device in which the relative orientation of uni-directional magnetic moments in parallel, vertically separated upper and lower magnetized layers, controls the flow of spin-polarized electrons tunneling through a very thin dielectric layer (the tunneling barrier layer) formed between those layers. When injected electrons pass through the upper layer they are spin polarized by interaction with the magnetic moment of that layer. The probability of such an electron then tunneling through the intervening tunneling barrier layer into the lower layer then depends on the availability of states within the lower electrode that the tunneling electron can occupy. This number, in turn, depends on the magnetization direction of the lower electrode. The tunneling probability is thereby spin dependent and the magnitude of the current (tunneling probability times number of electrons impinging on the barrier layer) depends upon the relative orientation of the magnetizations of magnetic layers above and below the barrier layer.

When used as a magnetic read head, the magnetic moment of the lower magnetized layer is fixed (pinned) in direction, while the magnetic moment of the upper magnetized layer is free to vary continuously under the action of the magnetic field of a moving magnetic medium (i.e. a disk). In that application, therefore, the MTJ device can be viewed as a kind of variable resistor, since different relative orientations of the magnetic moments will change the magnitude of a current passing through the device. When used as an information storage element in a magnetoresistive random access memory (MRAM) cell array, the magnetic moment of the upper layer is only allowed to have two orientations, parallel or antiparallel to the magnetic moment of the lower magnetized layer. In this case, the cell behaves as a resistor with only two resistance values, high (antiparallel) and low (parallel), which are treated as logical 1 and 0.

One of the critical challenges in MRAM technology is the patterning of the MTJ stack materials to form an MRAM cell. The term "stack," as used here, refers to the unpatterned, deposited layered structure of conducting, magnetic and dielectric materials. The phrase, "patterning of the stack," or the like, as used here, refers to the reduction of the lateral dimensions of the stack to the desired dimensions of the cell, typically accomplished by etching away portions of the stack peripherally disposed about an etch mask formed on the upper surface of the stack. Because the MTJ stack includes a very thin tunneling barrier layer, typically a layer of AlOx or MgO approximately 10 to 20 angstroms in thickness, shorting or shunting of the current around the junction is a critical problem. Clearly, imprecise patterning could create shorting pathways along the lateral edges of the cell. In addition, precise control of the size and shape of the MTJ cell during its patterning is increasingly important because these factors affect the magnetic and switching properties of the cell.

FIG. 1 is a schematic cross-sectional view of a typical prior art MTJ stack. The lower one (20) of the two magnetized layers, hereinafter called a pinned layer, has the direction of its magnetic moment fixed in direction, while the magnetic moment of the upper or free layer (40) can have its magnetic moment parallel to or antiparallel to the magnetic moment of the pinned layer. Looking at the figure from the bottom up, the layer configuration includes a substrate (130), which could be a bottom electrode used in read operations on the completed cell. A seed layer (5) that is used as a foundation on which to form successive overlayers is formed on the substrate. A layer of antiferromagnetic material, the AFM layer (10), is formed on the seed layer and will be used to pin the magnetic moment of the pinned layer by a form of magnetic coupling called exchange coupling. The lower, pinned layer (20) is a layer of ferromagnetic material formed on the AFM layer, or it can be a pair of ferromagnetic layers separated by a non-magnetic coupling layer. The tunneling barrier layer or junction layer (30) is then formed on the pinned layer, typically by first forming a layer of a metal such as aluminum (or magnesium) and then subjecting the aluminum (or magnesium) to oxidation. The free layer (40) is a ferromagnetic layer that is then formed on the junction layer.

FIG. 2 is a typical prior art configuration showing, schematically, a patterned MTJ cell (180) formed from the stack of FIG. 1. The cell is located between vertically separated conducting lines, the horizontally directed upper line (200) being a bit line and the transverse lower line (210) being a word line. A bottom electrode (130), such as the substrate in FIG. 1, contacting the bottom surface of the MTJ cell, is used to facilitate read operations and is electrically connected (by a conducting plug (140) passing through a via (145)) to circuitry, including a gate transistor (150) that controls the operation of the MRAM array. A protective, conducting capping layer (115), typically a layer of Ta in the prior art, is formed on the upper layer of the cell (180) as a result of the prior art patterning process as will be explained below By sensing the resistance state of the cell (180), which requires the passage of a current through the cell, the cell is "read," and by changing the resistance state, which requires an external magnetic field produced by the adjacent current-carrying conductors (200) and (210), the device is written upon.

As has been noted above, the cell of FIG. 2 has been patterned by etching away lateral portions of the stack of FIG. 1. One earlier prior art method of producing such an etch is by use of an ion-beam etch (IBE). Unfortunately, the IBE has several disadvantages, including non-selectivity, re-deposition of etched materials and the production of a tapered tail profile on the lateral etched edges of the stack. More recently, the reactive-ion etch (RIE) has supplanted the IBE as a prior art method of choice. An exemplary and commonly used method for producing a RIE is a process and corresponding system for carrying out the process, commercially supplied by Anelva. In this particular form of the process the RIE is occurs within a process chamber using a mixture of gases such as CO and $NH_3$ or $CH_3OH$, or $C_2H_5OH$, to etch the stack layers. The process proceeds most effectively by forming an etch resistant, patterned Ta hard mask on the upper surface of the MTJ stack and etching away those portions of the stack that are laterally disposed beyond the peripheral borders of the mask. Subsequent to the masking and etching, the Ta mask is allowed to remain on the patterned cell as a capping layer.

As a RIE hard masking material, Ta has some disadvantages. Among these disadvantages is the poor adhesion of Ta to dielectric layers, such as layers of SiN, $SiO_2$, F-doped SiOx and C-doped $SiO_2$ that are applied onto and around the patterned cell as insulating layers or interlevel dielectrics (ILD). This poor adhesion results in the peeling off of these dielectric layers from the Ta capping layer while the dielectric layers are smoothed and rendered planar (planarized) by processes such as chemical mechanical polishing (CMP). Experiments carried out by the present inventors have shown that the peeling off of the dielectric films was exacerbated if the $SiO_2$ was polished by CMP subsequent to an initial deposition of a layer of SiN. Thus, the efficacy and quality of the CMP process is compromised by the lack of adhesion of dielectric materials to the Ta capping layer. Another problem encountered when using the Ta hard mask was the oxidation of the Ta to form TaO by the RIE application of the gases noted above. Such oxidation increases the electrical resistance of the Ta layer and, therefore, adversely affects the electrical performance of the cell.

Because of the aforementioned disadvantages of the Ta hard mask layer in RIE patterning of MTJ stacks, it is clear that an alternative masking structure is needed.

The common use of the RIE in the industry at many stages of MRAM array fabrication produces a great deal of published prior art that discloses a Ta hard mask and its use in an associated RIE. There is also prior art that discloses alternative masking materials and methods. For example, Costrini et al. (US Published Patent Application 2005/0277207) disclose an RIE process in which a succession of masks are used, including a Ta or TaN hard mask between 1500 and 6000 angstroms in thickness, over which is formed a thicker mask that is subsequently removed. In the disclosed process, the thicker mask is a sacrificial mask and the hard mask remains as a capping layer. Kim et al. (U.S. Pat. No. 6,806,096) also discloses a hard mask of Ta, TiN or TaN over which is formed an insulating layer of SiN or $SiO_2$. Ning (U.S. Pat. No. 6,635,496) teaches a method of depositing a Ta mask that does not require patterning in the standard way.

Leuschner et al. (U.S. Pat. No. 6,815,248) teaches a superposition of masks in which an upper or lower mask is formed of WN and a corresponding lower or upper mask is formed of TiN or TaN. Gaidis et al. (US Patent Application Publication 2005/0277206) teaches the use of a TaN or TiN hard mask that is removed to allow a partial deactivation of a free layer by an oxidation process. Nakajima et al. (U.S. Pat. No. 6,916,677) teaches a hard mask that is peeled off. Asao et al. (U.S. Pat. No. 6,900,490) and Asao (U.S. Pat. No. 6,882,563) teach the formation of an MTJ cell with a curved shape that corresponds to the curvature of magnetic field lines. A Ta mask is used to pattern the curved cell. Park et al. (U.S. Pat. No. 6,849,465) teaches a first patterning of a lower electrode followed by a second patterning of a magnetically soft layer formed on the lower electrode using a hard mask of either Ti, TiN, Ta, or TaN.

The present invention prefers to retain the basic Ta layer because of its advantageous capping properties, while forming an additional layer of TaN over the Ta layer to both protect the Ta layer and to provide advantageous adhesion properties with respect to surrounding dielectric layer formation.

SUMMARY OF THE INVENTION

A first object of this invention is to provide a hard mask structure to be used in the RIE patterning of an MTJ stack A second object of the present invention is to provide a hard mask structure that does not have the disadvantageous properties of prior art hard masks that also serve as capping layers, such as poor adhesion of dielectric layers and mask oxidation.

A third object of the present invention is to provide a hard mask structure that can be used to precisely define an MTJ pattern and, thereby, precisely define the size and shape of the resulting cell.

A fourth object of the present invention is to provide such a hard mask structure that can, itself, be easily patterned within the fabrication process steps.

A fifth object of this invention is to provide an MTJ MRAM cell capped by a non-oxidized layer that has served as a hard mask for the patterning of said cell and surrounded by insulating layers exhibiting good adhesion and, therefore, effective planarization.

These objects will be met by use of a hard mask that is formed by patterning a Ta/TaN bilayer deposited over the upper surface of an MTJ stack. The Ta is first deposited on the MTJ stack. A TaN layer is then formed over the Ta layer. The TaN both protects the Ta from oxidation during RIE processing and provides good adhesion for the subsequently formed dielectric layers of, for example, SiN and $SiO_2$, F-doped SiOx and C-doped $SiO_2$. Advantageously for the entire fabrication process, the Ta/TaN structure is easily patterned in the same RIE chamber in which the stack will be patterned, using $CF_4$ gas as an etching agent for the mask. The stack is them patterned using CO and $NH_3$ or $CH_3OH$, or $C_2H_5OH$ as etching gases, whereupon the hard mask remains on the cell as a capping layer. Dielectric layers are then deposited on and around the cell and planarized by CMP, without there being a peeling off or peeling away of the dielectric layers from the cell, to provide a smooth and planar surface on which, for example, a conducting bit line can be formed.

BRIEF DESCRIPTION OF THE DRAWINGS

The objects, features, and advantages of the present invention are understood within the context of the Description of the Preferred Embodiment as set forth below. The Description of the Preferred Embodiment is understood within the context of the accompanying figures, wherein:

FIG. 1 is a schematic representation of an exemplary prior-art MTJ stack.

FIG. 2 is a schematic representation of a prior art patterned MTJ cell formed between adjacent word and bit lines.

FIGS. 3, 4 and 5 are successive schematic cross-sectional views showing the Ta/TaN hard mask bilayer being formed on an MTJ stack (FIG. 3), showing the Ta/TaN bilayer being patterned to form a mask (FIG. 4) and showing the stack being patterned to final cell dimensions using the mask (FIG. 5).

DESCRIPTION OF THE PREFERRED EMBODIMENTS

The preferred embodiment of the present invention is the formation and use of a bilayer Ta/TaN hard mask, that is used to pattern an MTJ stack using a reactive ion etch (RIE) and to produce, thereby, an MTJ cell suitable for use in an MRAM array. The patterned cell so produced is capped by the Ta/TaN mask, providing a TaN upper surface that has good adhesion to the surrounding dielectric layers and further providing a non-oxidized and low resistance Ta layer immediately adjacent to and contacting the upper surface of the MTJ cell.

Referring to FIG. 3, there is shown an MTJ stack of the type shown in FIG. 1 (all layers and designating numerals being identical to those described in FIG. 1) on which is being formed a Ta/TaN bilayer (100), (110), to be patterned and used as the mask of the present invention. The lower layer (100) is a layer of Ta deposited on the upper ferromagnetic free layer (40) of the stack by any of the prior art deposition methods including PVD, CVD, or ALD, to a thickness between approximately 200 and 400 angstroms. A layer of TaN (110) is then deposited on the Ta layer, to a thickness between approximately 100 and 200 angstroms, also by PVD, CVD, or ALD, to form the bilayer of the present invention.

Figure 4:
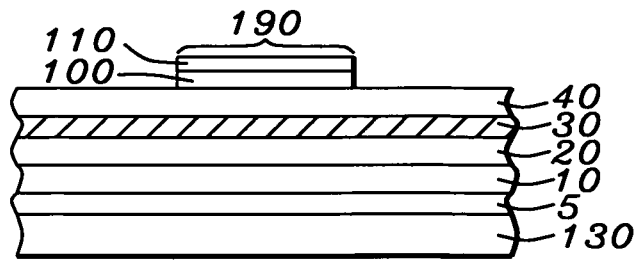

Referring next to FIG. 4, there is shown the fabrication of FIG. 3 wherein the bilayer (100) and (110) has been patterned by removal of laterally disposed portions to produce a mask (190) of dimension substantially equal to the desired final cell dimensions. The removal of bilayer material is accomplished (not shown) by use of a gas such as $CF_4$ in the same RIE chamber as will be used for the subsequent stack patterning. This dual use of a single chamber is a distinct advantage as it produces a more efficient fabrication process.

Figure 5:
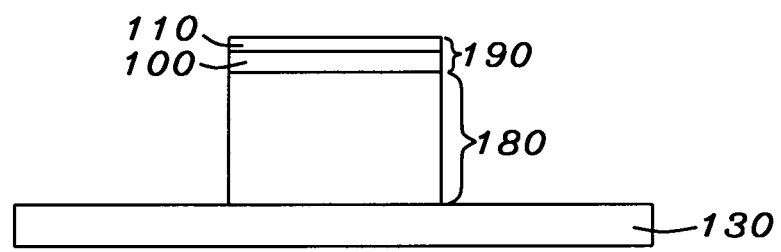

Referring next to FIG. 5, there is shown the fabrication of FIG. 4 subsequent to the removal of stack material laterally peripheral to the mask. The stack removal is accomplished in the same RIE chamber using a gas mixture such as CO and $NH_3$ or $CH_3OH$, or $C_2H_5OH$. Subsequent to the stack removal, the mask (190) remains on the stack as a protective capping layer. Note that the lower electrode (130) is typically patterned to a different dimension that the cell itself.

Figure 6:
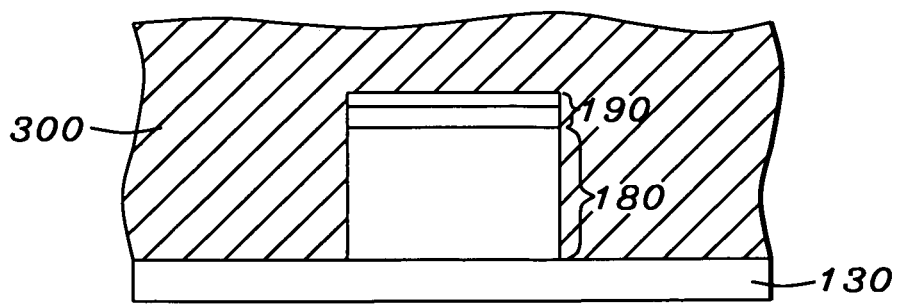
FIG. 6 is a schematic drawing of the patterned MTJ stack of FIG. 5 showing an exemplary dielectric insulating layer formed over and around the patterned stack, which is now a cell.

Referring next to FIG. 6, there is shown the patterned stack of FIG. 5, now denoted a MTJ cell (180), surrounded by an interlayer dielectric (ILD) material (300), typically SiN, $SiO_2$, F-doped SiOx, C-doped $SiO_2$ and their layered combinations. Note, there are array elements already formed beneath this fabrication (see FIG. 2) that are not shown in this figure. It is an aspect of the present invention that SiN may be deposited over the cell as a first layer followed by a layer of $SiO_2$ and yet a subsequent planarization by CMP will proceed advantageously.

Figure 7:
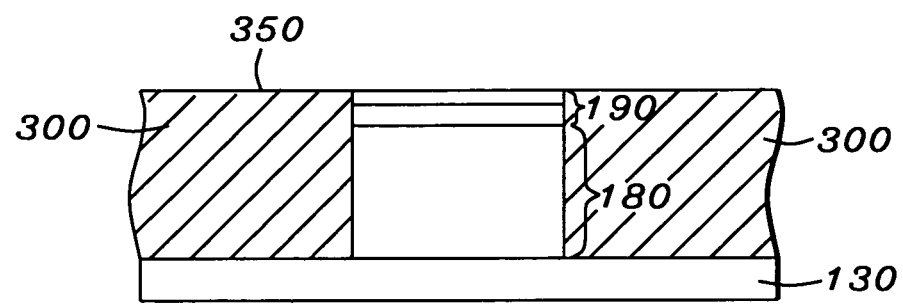
FIG. 7 shows the cell of FIG. 6 subsequent to a CMP process used to planarize the upper surface of the dielectric insulating layer prior to (in this example) the formation of a conducting line, such as a bit line, over the upper surface of the cell and the insulating layer.

Referring next to FIG. 7, there is shown the fabrication of FIG. 6 subsequent to the application of a CMP (chemical mechanical polishing) to form a planar upper surface (350), including a planar surface of the ILD and a coplanar upper surface of the cell capping layer (190). Such a planar surface is necessary for the subsequent formation of a bit line (not shown). As noted above, the CMP process is effectively accomplished with the capping layer (190) being the Ta/TaN mask, because the CMP process does not cause the ILD to lose its adhesion with the capping layer and peel off or peel away from the cell during the process.

Figure 8:
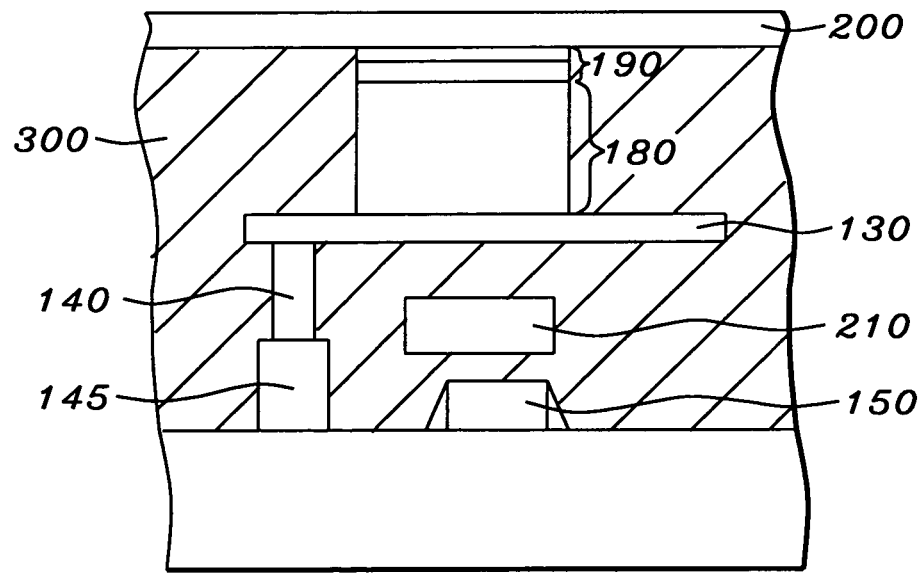
FIG. 8 is a schematic cross-sectional view showing the MTJ cell, the hard mask of the present invention now being a capping layer, positioned between adjacent word and bit lines and surrounded by dielectric material layers that have been effectively planarized as a result of the adhesion of the surrounding dielectric layers to the capping layer. The figure also shows the electrical connections between the cell and array circuitry.

FIG. 8 now shows the fabrication of FIG. 7 and further includes an exemplary portion of an MRAM array (similar to that in FIG. 2), showing a horizontally directed bit line (200) formed above the cell, a word line (210) perpendicularly directed to the bit line and vertically separated from the bit line and beneath the cell and an electrical connection (140) from the lower electrode (130), through a via (145) to external circuitry (150). The circuitry is pictured in a purely exemplary and schematic fashion as including a gate transistor (150) formed on a Si substrate, but the specifics of the circuitry is well known in the prior art and is not an aspect of the invention. Significantly different from FIG. 2 is the capping layer (190) and the fact that the bit line (200) has been formed on a planarized surface of a dielectric layer that did not exhibit the problems of de-adhesion that are common in the prior art.

As is finally understood by a person skilled in the art, the preferred embodiments of the present invention are illustrative of the present invention rather than limiting of the present invention. Revisions and modifications may be made to methods, materials, structures and dimensions employed in forming and providing a bilayer Ta/TaN hard mask for a RIE patterning of an MRAM cell and the cell patterned using the mask, while still forming and providing such a mask and patterned cell in accord with the spirit and scope of the present invention as defined by the appended claims.

What is claimed is:

1. A patterned MRAM MTJ cell comprising:
   an MTJ stack, said stack including an upper ferromagnetic free layer, a lower ferromagnetic pinned layer and a tunneling barrier layer formed therebetween;
   a single bilayer capping and masking layer formed on said upper ferromagnetic free layer of said MTJ stack, said single bilayer comprising:
      a capping layer of Ta formed to a thickness between 200 and 400 angstroms on said ferromagnetic free layer, said Ta layer being substantially free of oxidation;
      a masking layer of TaN formed to a thickness between 100 and 200 angstroms on top of said layer of Ta; wherein
   said single bilayer capping and masking layer are patterned and
   said MTJ stack is conformally patterned by said patterned single bilayer capping and masking layer and wherein said TaN layer protects said Ta capping layer and provides improved adhesion to contiguous dielectric materials; whereby
   a layer of dielectric material formed surrounding said MTJ cell is rendered smooth and coplanar and well bonded to an upper surface of said TaN layer as a result of said improved adhesion properties.

2. The MRAM cell of claim 1 wherein said layer of dielectric material is a layer of SiN, $SiO_2$, F-doped SiOx, C-doped $SiO_2$ and their laminated combinations and said layer of dielectric material is rendered smooth and coplanar, with no loss of adhesion, by a process of CMP.

* * * * *